US011615286B2

(12) United States Patent
Lin et al.

(10) Patent No.: US 11,615,286 B2
(45) Date of Patent: Mar. 28, 2023

(54) COMPUTING SYSTEM AND COMPRESSING METHOD FOR NEURAL NETWORK PARAMETERS

(71) Applicant: NEUCHIPS CORPORATION, Hsinchu (TW)

(72) Inventors: Youn-Long Lin, Hsinchu (TW); Chao-Yang Kao, Hsinchu (TW); Huang-Chih Kuo, Hsinchu (TW); Chiung-Liang Lin, Hsinchu (TW)

(73) Assignee: NEUCHIPS CORPORATION, Hsinchu (TW)

( * ) Notice: Subject to any disclaimer, the term of this patent is extended or adjusted under 35 U.S.C. 154(b) by 830 days.

(21) Appl. No.: 16/516,202

(22) Filed: Jul. 18, 2019

(65) Prior Publication Data
US 2020/0372320 A1    Nov. 26, 2020

(30) Foreign Application Priority Data
May 24, 2019   (TW) .................................. 108118062

(51) Int. Cl.
 *G06N 3/04* (2023.01)
 *H03M 7/30* (2006.01)
(52) U.S. Cl.
 CPC .............. *G06N 3/04* (2013.01); *H03M 7/702* (2013.01)
(58) Field of Classification Search
 CPC ........ G06N 3/04; H03M 7/40; H03M 7/3077; H03M 7/6047; H03M 7/6076; H03M 7/702
 See application file for complete search history.

(56) References Cited

U.S. PATENT DOCUMENTS

2001/0038347 A1* 11/2001 Avery ..................... H03M 7/30
                                                 341/51
2014/0046885 A1*  2/2014 Majumdar ............... G06N 3/02
                                                 706/22
(Continued)

FOREIGN PATENT DOCUMENTS

CN         1625170       6/2005
CN        108616927     10/2018
(Continued)

OTHER PUBLICATIONS

Gong, Yunchao, et al. "Compressing deep convolutional networks using vector quantization." arXiv preprint arXiv:1412.6115 (2014): 1-10. (Year: 2014).*

(Continued)

*Primary Examiner* — Kamran Afshar
*Assistant Examiner* — Randall K. Baldwin
(74) *Attorney, Agent, or Firm* — JCIPRNET

(57) ABSTRACT

A computing system and a compressing method for neural network parameters are provided. In the method, multiple neural network parameters are obtained. The neural network parameters are used for a neural network algorithm. Every at least two neural network parameters are grouped into an encoding combination. The number of neural network parameters in each encoding combination is the same. The encoding combinations are compressed with the same compression target bit number. Each encoding combination is compressed independently. The compression target bit number is not larger than a bit number of each encoding combination. Thereby, the storage space can be saved and excessive power consumption for accessing the parameters can be prevented.

6 Claims, 7 Drawing Sheets

(56) References Cited

U.S. PATENT DOCUMENTS

| | | | |
|---|---|---|---|
| 2018/0107926 A1* | 4/2018 | Choi | G06N 3/0472 |
| 2018/0167083 A1 | 6/2018 | Dubey et al. | |
| 2019/0044535 A1* | 2/2019 | Ahmad | H03M 7/46 |
| 2020/0186808 A1* | 6/2020 | Joshi | H04N 19/159 |
| 2020/0275101 A1* | 8/2020 | Coelho | H04N 19/176 |

FOREIGN PATENT DOCUMENTS

| | | |
|---|---|---|
| TW | 502178 | 9/2002 |
| TW | 201411509 | 3/2014 |

OTHER PUBLICATIONS

Han, Song, Huizi Mao, and William J. Dally. "Deep compression: Compressing deep neural networks with pruning, trained quantization and huffman coding." arXiv preprint arXiv:1510.00149 (2015): 1-14 (Year: 2015).*

Chen, Wenlin, et al. "Compressing neural networks with the hashing trick." International conference on machine learning. PMLR, 2015. (Year: 2015).*

Parashar, Angshuman, et al. "SCNN: An accelerator for compressed-sparse convolutional neural networks." ACM SIGARCH computer architecture news 45.2 (2017): 27-40. (Year: 2017).*

Choi, Jungwook, et al. "Accurate and efficient 2-bit quantized neural networks." Proceedings of Machine Learning and Systems 1 (Apr. 2, 2019): 348-359. (Year: 2019).*

Cheng, Yu, et al. "A survey of model compression and acceleration for deep neural networks." arXiv preprint arXiv:1710.09282 v7 (Feb. 2019). (Year: 2019).*

Choi, Yoojin, Mostafa El-Khamy, and Jungwon Lee. "Towards the limit of network quantization." arXiv preprint arXiv:1612.01543v2 (2017): 1-14 (Year: 2017).*

Khoram, Soroosh, and Jing Li. "Adaptive quantization of neural networks." International Conference on Learning Representations. 2018: 1-13 (Year: 2018).*

Jiabao Liu et al., "Dynamic parameter control method for process data compression ratio," Journal of Computer Engineering and Applications, vol. 49, Issue 8, Jul. 2013, pp. 138-141.

* cited by examiner

COMPUTING SYSTEM AND COMPRESSING METHOD FOR NEURAL NETWORK PARAMETERS

CROSS-REFERENCE TO RELATED APPLICATION

This application claims the priority benefit of Taiwan application serial no. 108118062, filed on May 24, 2019. The entirety of the above-mentioned patent application is hereby incorporated by reference herein and made a part of this specification.

BACKGROUND

Technical Field

The disclosure relates to a neural network technique, and more particularly to a computing system and a compressing method for neural network parameters.

Description of Related Art

The neural network is an important topic in artificial intelligence (AI) and decisions thereof are made by simulating the operation of human brain cells. It is worth noting that there are many neurons in the human brain cells and the neurons are connected to one another through synapses. In which, each neuron can receive signals via the synapse. Also, the output of the signals after transformation is re-transmitted to another neuron. The transformation ability of each neuron is different and human beings can form the abilities to think and judge through the operations of the signal transmission and transformation. The neural network obtains the corresponding ability according to the operations.

In order to improve stability and accuracy, many neurons and hidden layers may be disposed in the neural network. However, in order to store parameters used by the neural network model, a large amount of storage space is usually required, thereby increasing the hardware cost. In addition, during neural network computing, the parameters have to be read from the storage space, so a large amount of power consumption is required. As such, effectively solving the problems caused by writing or reading of the parameters is one of the goals to strive for in related field.

SUMMARY

In view of the above, the disclosure provides a computing system and a compressing method for neural network parameters, which group and independently compress parameters with a fixed target data amount, further provide a selection for multiple compression modes to reduce the data amount to be stored, and provide a coding result with less distortion.

A compression method for neural network parameters according to the embodiment of the disclosure includes the following steps. Multiple neural network parameters are obtained. The neural network parameters are used for a neural network algorithm. Every at least two neural network parameters are grouped into an encoding combination. The number of the neural network parameters in each encoding combination is the same. The encoding combinations are compressed with the same compression target bit number. Each encoding combination is independently compressed. The compression target bit number is not larger than the bit number of each encoding combination.

A computing system for neural network parameters according to the embodiment of the disclosure includes, but is not limited to, a memory and a processor. The processor is coupled to the memory and configured to execute the following steps. Multiple neural network parameters are obtained. The neural network parameters are used for a neural network algorithm. Every at least two neural network parameters are grouped into an encoding combination. The number of the neural network parameters in each encoding combination is the same. The encoding combinations are compressed with the same compression target bit number. Each encoding combination is independently compressed. The compression target bit number is not larger than the bit number of each encoding combination. The compression results of the encoding combinations are stored in the memory.

Based on the above, in the computing system and the compression method for neural network parameters according to the embodiment of the disclosure, a distortion compression is adopted and multiple fixed compression ratios (i.e., fixed compression target bit number) are provided for the user to select from. After the parameters are grouped, individual encoding combination is independently compressed and the data amount of each group of parameters after compression is fixed. In addition, the encoding compressions of multiple compression modes are performed on each encoding combination and a final compression result is selected as an output according to the compressing distortions. As such, the amount of the storage space used can be saved, thereby reducing the accessing power consumption.

To make the aforementioned and other features of the disclosure more comprehensible, several embodiments accompanied with drawings are described in detail as follows.

DETAILED DESCRIPTION OF DISCLOSED EMBODIMENTS

Figure 1:
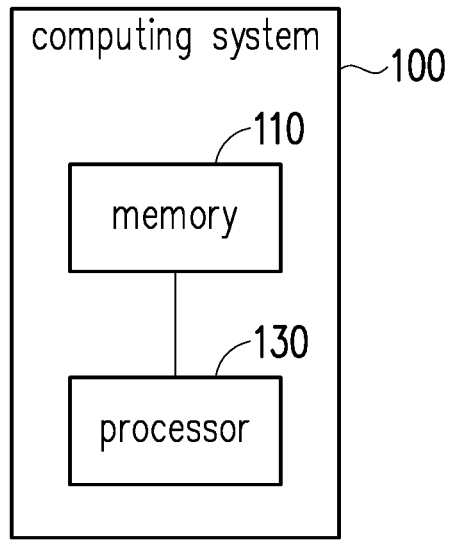
FIG. 1 is a block diagram of elements of a computing system in accordance with an embodiment of the disclosure.

FIG. 1 is a block diagram of elements of a computing system in accordance with an embodiment of the disclosure. Referring to FIG. 1, a computing system 100 includes, but is not limited to, a memory 110 and a processor 130. The computing system 100 may be implemented in various types of digital circuits, processing circuits such as a micro control unit (MCU), a computing unit (CU), a processing element (PE), a system on chip (SoC), an integrated circuit (IC), or an independent computer system (for example, a desktop computer, a notebook computer, a server, a mobile phone, a tablet computer, etc.). More notably, the computing system 100 according to the embodiment of the disclosure may be used to process neural network parameters (for example, input values of neurons, weights, biases, etc.) used by a neural network algorithm. The detailed content thereof shall be illustrated in the following embodiments.

The memory 110 may be a fixed or removable random-access memory (RAM), a read-only memory (ROM), a flash memory, a similar element, or a combination of the above elements. In the embodiment of the disclosure, the memory 110 is used to record the neural network parameters and provide the stored neural network parameters to be accessed by other circuit, processor, or independent device.

The processor 130 is coupled to the memory 110. The processor 130 may be a circuit composed of a multiplexer, an adder, a multiplier, an encoder, a decoder, or one or more of various types of logic gates, and may be a central processing unit (CPU), other programmable general purpose or special purpose microprocessor, digital signal processor (DSP), programmable controller, application-specific integrated circuit (ASIC), other similar element, or a combination of the above elements. In some embodiments, the operation of the processor 130 may be implemented through software.

In order to facilitate understanding of the operation procedure of embodiments of the disclosure, several embodiments will be exemplified below to illustrate in detail the operation procedure of the computing system 100 in the embodiments of the disclosure. Hereinafter, the method described in the embodiment of the disclosure will be illustrated in conjunction with various elements or circuits in the computing system 100. The various procedures of the method may be adjusted according to the implementation situation and are not limited thereto.

Figure 2:
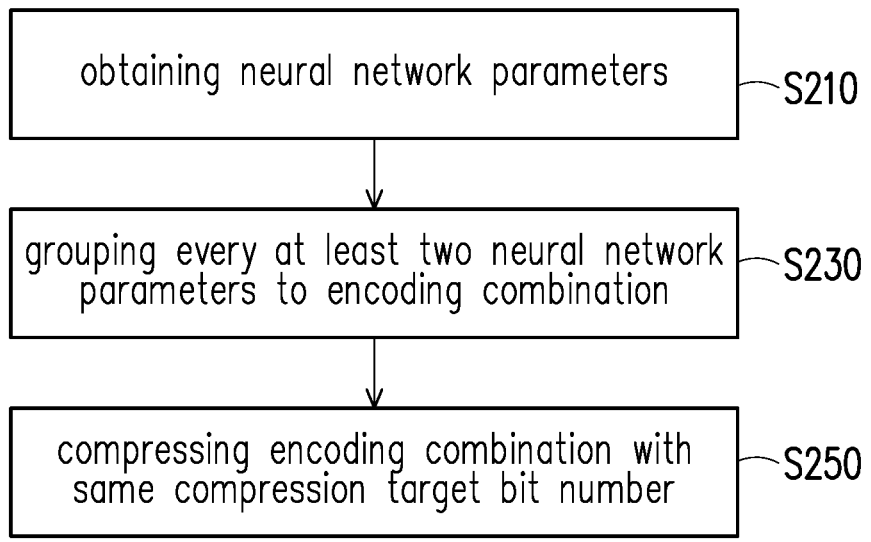
FIG. 2 is a flow chart of a compression method for neural network parameters in accordance with an embodiment of the disclosure.

FIG. 2 is a flow chart of a compression method for neural network parameters in accordance with an embodiment of the disclosure. Referring to FIG. 2, the processor 130 obtains the neural network parameters from a data source (not shown) (Step S210). Specifically, the data source may be another device, transmission interface, storage medium, or the memory 110. For example, sensory data obtained by a sensor or data downloaded via the Internet is used as an input value in a neural network model.

Figure 3:
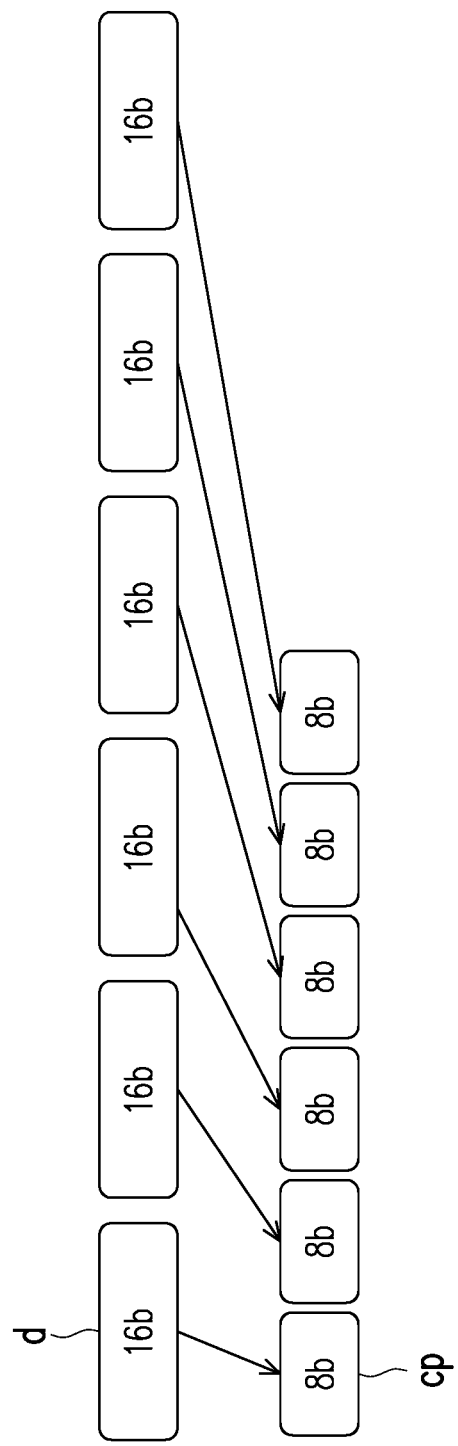
FIG. 3 is a schematic diagram of single parameter with fixed length encoding.

Next, the processor 130 groups every at least two neural network parameters into an encoding combination (Step S230). Specifically, conventional technology regarding the compression technology of neural network parameters generally adopts single parameter with fixed length encoding or single parameter with variable length encoding. FIG. 3 is a schematic diagram of single parameter with fixed length encoding. Referring to FIG. 3, a quantization encoding is a common method of a single parameter with fixed length encoding, which uniformly quantizes each parameter to a fixed length (i.e., a bit number (b)). The example shown in FIG. 3 individually quantizes all 16-bit neural network parameters d to a compression result cp of 8 bits (i.e., the fixed length is 8 bits). Although such encoding method may quickly and easily process decompression in parallel, the disadvantage is that the overall parameter characteristics cannot be considered, causing the distortion after compression to be larger.

Figure 4:
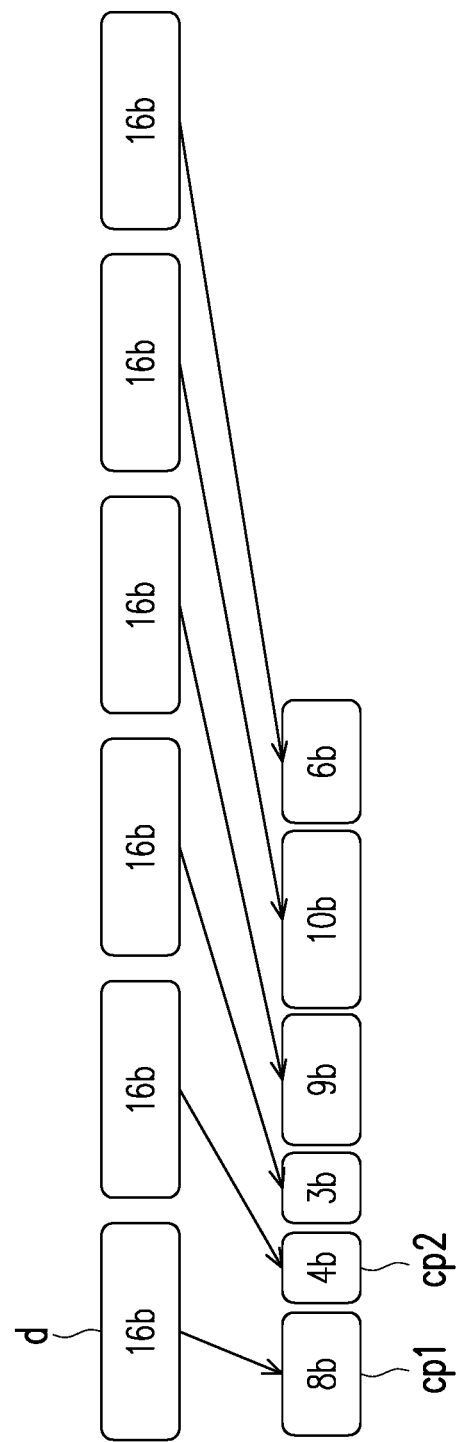
FIG. 4 is a schematic diagram of single parameter with variable length encoding.

FIG. 4 is a schematic diagram of single parameter with variable length encoding. Referring to FIG. 4, Huffman encoding is a common method of single parameter with variable length encoding, in which the length of each parameter after encoding is not fixed (i.e., the target code bit numbers are not necessarily the same). Such compression method takes into consideration the overall parameter distribution characteristics, so under the same compression ratio, the compression quality is better than the single parameter with fixed length encoding. However, the disadvantages of the variable length encoding method is that the decompression is complicated and there is data dependency between the parameters, so a parameter may only be decompressed after the previous parameter is decompressed. Therefore, the parameters need to be decompressed one after the other and cannot be decompressed in parallel. In the example shown in FIG. 4, a 16-bit parameter d may be a compression result cp1 of 13 bits, a compression result cp2 of 4 bits, or other bit numbers after compression.

In the embodiment of the disclosure, all neural network parameters are grouped first, at least two neural network parameters are assigned to the same encoding combination, and the neural network parameters in each encoding combination are not repeated. For example, the first to fourth neural network parameters are assigned to the first encoding combination, and the fifth to eighth neural network parameters are assigned to the second encoding combination. As compared to the single parameter encoding method, the embodiment of the disclosure considers the overall parameter characteristics, so that more data amount may be simultaneously encoded or subsequently decoded, thereby improving efficiency. It should be noted that the number of neural network parameters in each encoding combination may be changed according to actual requirements, and is not limited to the embodiment of the disclosure.

Next, the processor 130 compresses the encoding combinations with the same compression target bit number (Step S250). Specifically, the embodiment of the disclosure adopts a fixed length encoding manner to preserve the advantage of processing subsequent decoding in parallel. The compression target bit number is the total bit number of the final compression result of each encoding combination. Therefore, the compression target bit number is usually not larger than the bit number of each encoding combination. For example, the encoding combination includes three 8-bit neural network parameters and the compression target bit number is 12 bits. The computing system 100 may provide multiple compression target bit numbers for the user to select from and receive the selection result of the user through an input device (not shown; for example, a keyboard, a mouse, a touch panel, etc.). Alternatively, the processor 130 may use a preset compression target bit number or change the compression target bit number using a preset rule.

It is worth noting that the compression of each encoding combination by the processor 130 is performed independently and there is no data dependency between different encoding combinations. In addition, a single neural network parameter within the same encoding combination may utilize either a fixed length encoding method or a variable length encoding method. In other words, each neural network parameter within every encoding combination is not limited by a specific compression amount or compression ratio. The compression amount or compression ratio may be adjusted elastically as long as the total bit number of each encoding combination after compression is the same. Alternatively, there may be data dependency among more than two neural network parameters within the same encoding combination. During the decompression process according to the embodiment of the disclosure, not only is each encoding combination decompressed in parallel (lower complexity), but the characteristics of the entire group of parameters are also considered to improve the compression quality. In other words, the embodiment of the disclosure does not limit whether the neural network parameters in each encoding combination adopt the same or different data compression algorithm. For example, the data compression algorithm may be a lossy or a lossless algorithm such as quantization, averaging, Huffman, or arithmetic encoding.

Figure 5A:
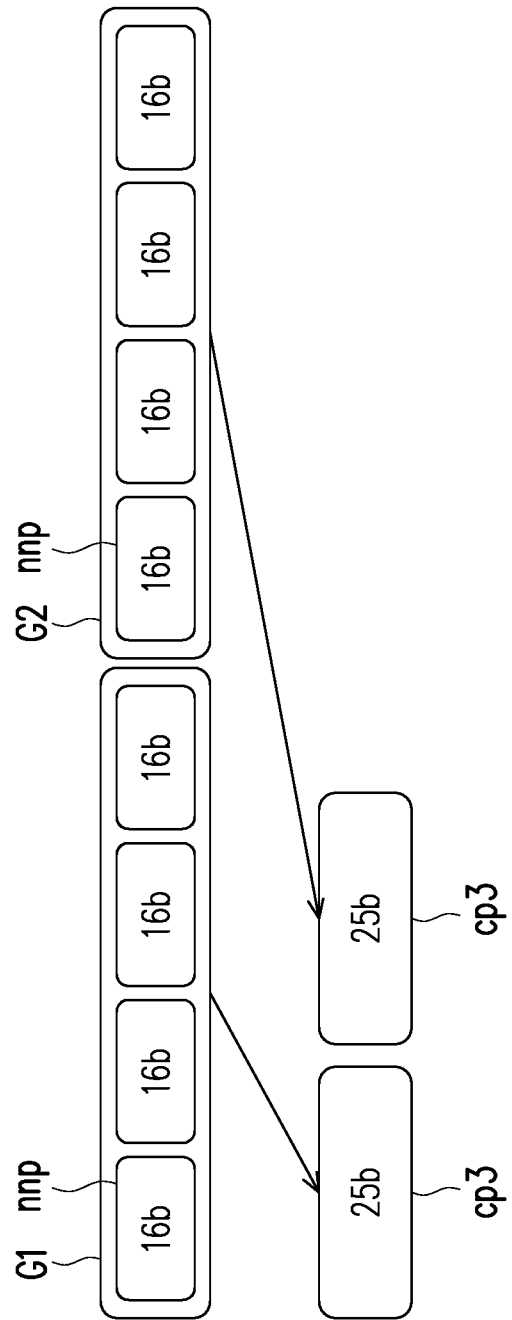
FIG. 5A is a schematic diagram of grouping codes in accordance with an embodiment of the disclosure.

FIG. 5A is a schematic diagram of grouping codes in accordance with an embodiment of the disclosure. Referring to FIG. 5A, in a compression combination G1 and a compression combination G2, there are respectively four neural network parameters. That is, every four neural network parameters nnp are assigned to a compression combination. The total bit number of the neural network parameters nnp in each of the compression combinations G1 and G2 is 64 bits (16×4). The compression target bit number of the embodiment is 25 bits, that is, the total bit number of a compression result cp3 after encoding compression of each of the compression combinations G1 and G2 is 25 bits.

Figure 5B:
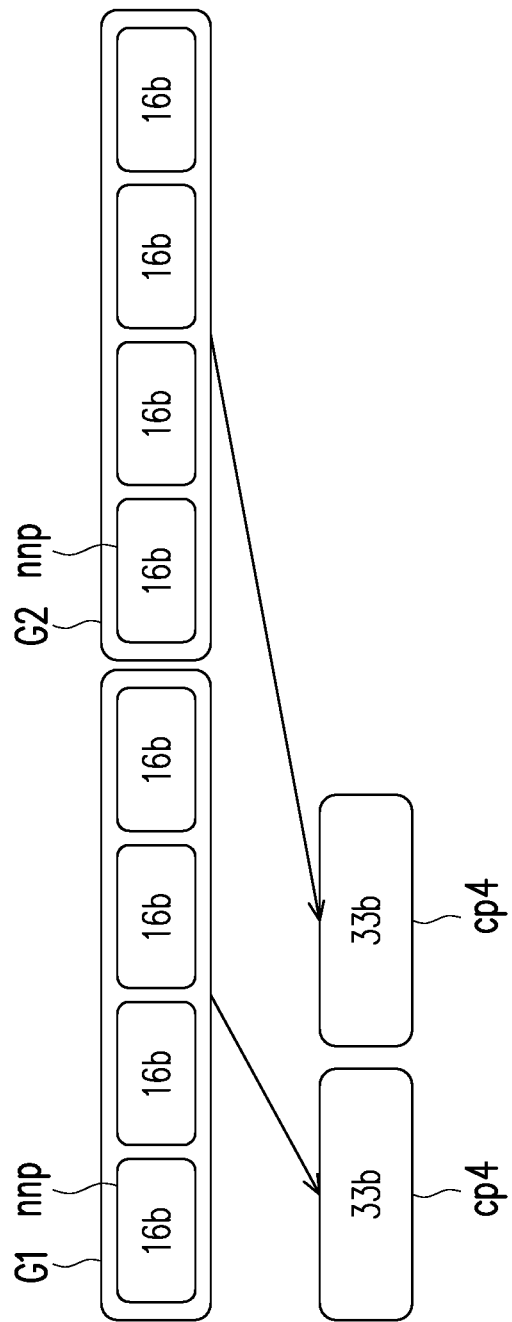
FIG. 5B is a schematic diagram of grouping codes in accordance with another embodiment of the disclosure.

The computing system 100 may also provide other compression target bit numbers/compression ratios for the user to select from. FIG. 5B is a schematic diagram of grouping codes in accordance with another embodiment of the disclosure. Referring to FIG. 5B, the difference from FIG. 5A is that the compression target bit number of the embodiment is 33 bits, that is, the total bit number of the compression result cp4 after encoding compression of each of the compression combinations G1 and G2 is 33 bits.

It should be noted that the embodiment of the disclosure does not limit the compression target bit number available for change and persons applying the embodiment of the disclosure may change according to actual requirements.

In addition, as compared to using a fixed compression mode to encode (i.e., all neural network parameters are compressed using the same data compression algorithm, where there may be a lack of flexibility and the compression effect may be poor (lower ratio or larger error)), the embodiment of the disclosure combines multiple data compression methods and the best result is selected as the output, which will be illustrated in detail below.

Figure 6:
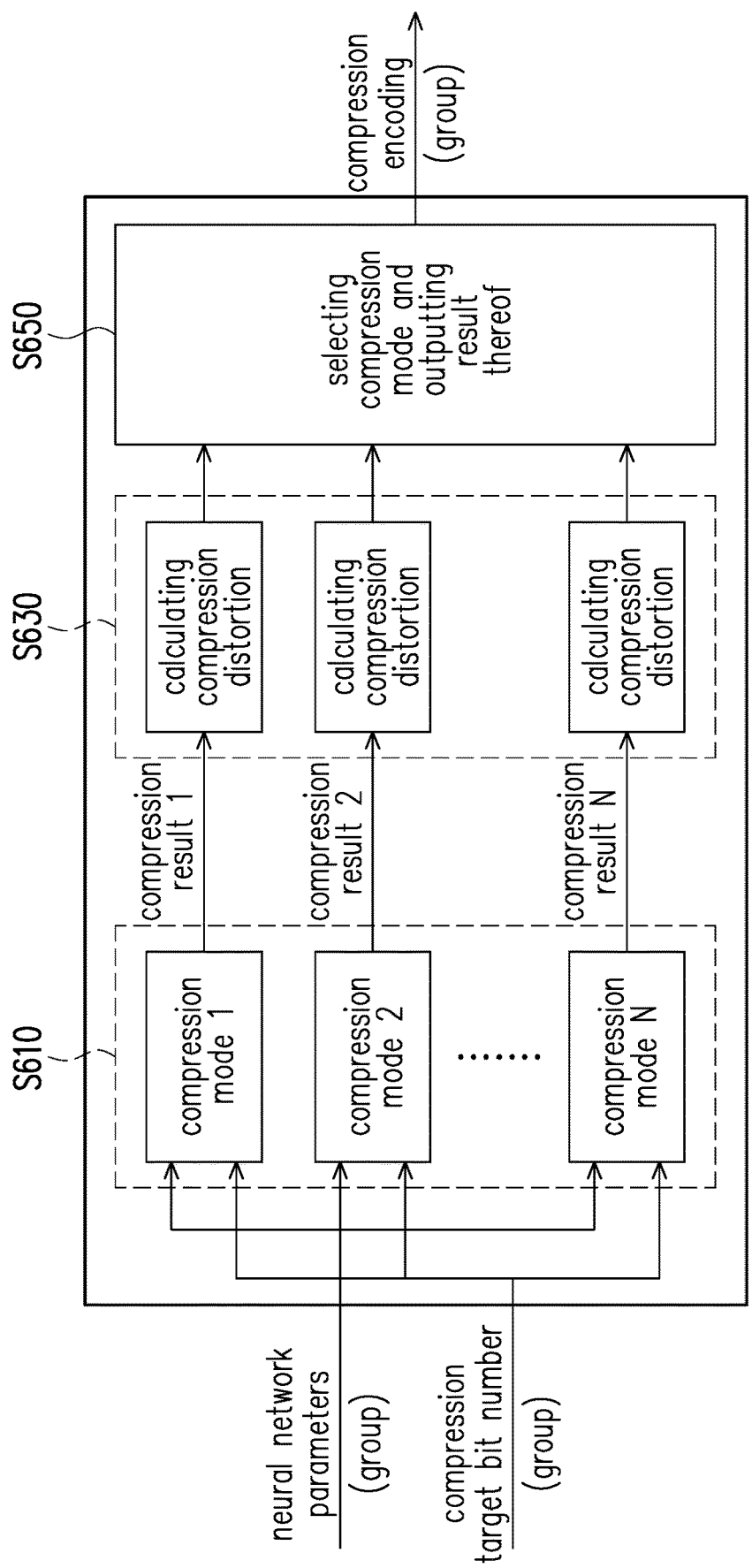
FIG. 6 is a parallel flow chart of multiple compression modes in accordance with an embodiment of the disclosure.

FIG. 6 is a parallel flow chart of multiple compression modes in accordance with an embodiment of the disclosure. Referring to FIG. 6, the processor 130 compresses each encoding combination through multiple different compression modes (Step S610). Assuming that there are N types of different compression modes (i.e., different data compression algorithms, where N is a positive integer larger than one), the processor 130 performs compression encoding processing of different compression modes to each encoding combination according to the same compression target bit number, so as to obtain N compression results. The processor 130 then decodes each compression result through the corresponding compression mode and compares the not yet encoded (original) neural network parameters with the decoded result, so as to obtain a compression distortion (Step S630). The processor 130 may calculate the sum of compression errors, the mean square error (MSE) of compression errors, the sum of squared error (SSE), etc., of all the neural network parameters in a single encoding combination, so as to obtain the compression distortion of the encoding combination. Next, the processor 130 selects one of the compression results of the compression modes as a final compression result of the encoding combination and outputs the final compression result (Step S650). In one embodiment, the processor 130 selects according to the compression distortions of the compression modes. The processor 130 may select the compression result with the least compression distortion in the compression modes as the final compression result. The processor 130 may store the compression result of the encoding combination in the memory 110. As such, the storage space of the memory 110 can be saved, the power consumption when accessing the compression result can be saved, and the compression distortion can be reduced as much as possible.

It should be noted that in other embodiments, the processor 130 may select the compression mode according to the number of neural network parameters in a single compression combination, or other conditions.

Inevitably, the compression distortions of different neural network parameters using the same compression mode may be different. If the aforementioned method of selecting the least compression distortion is adopted, the compression modes for different compression combinations may be different. In order to identify the type of compression mode adopted by the final compression result, the processor 130 appends an identification code corresponding to the selected compression mode to the final compression result. The identification code may be one or more identification bits and is located in the first bit or another specific bit of the final compression result. Different compression modes have unique identification codes. Therefore, the processor 130 may directly obtain the compression mode used from the compression result.

It should be noted that, in other embodiments, the processor 130 may directly select a corresponding decompression mode in a specific block of the memory 110 according to the corresponding compression mode recorded in each compression result or by using other recording methods to facilitate the decompression process.

Figure 7:
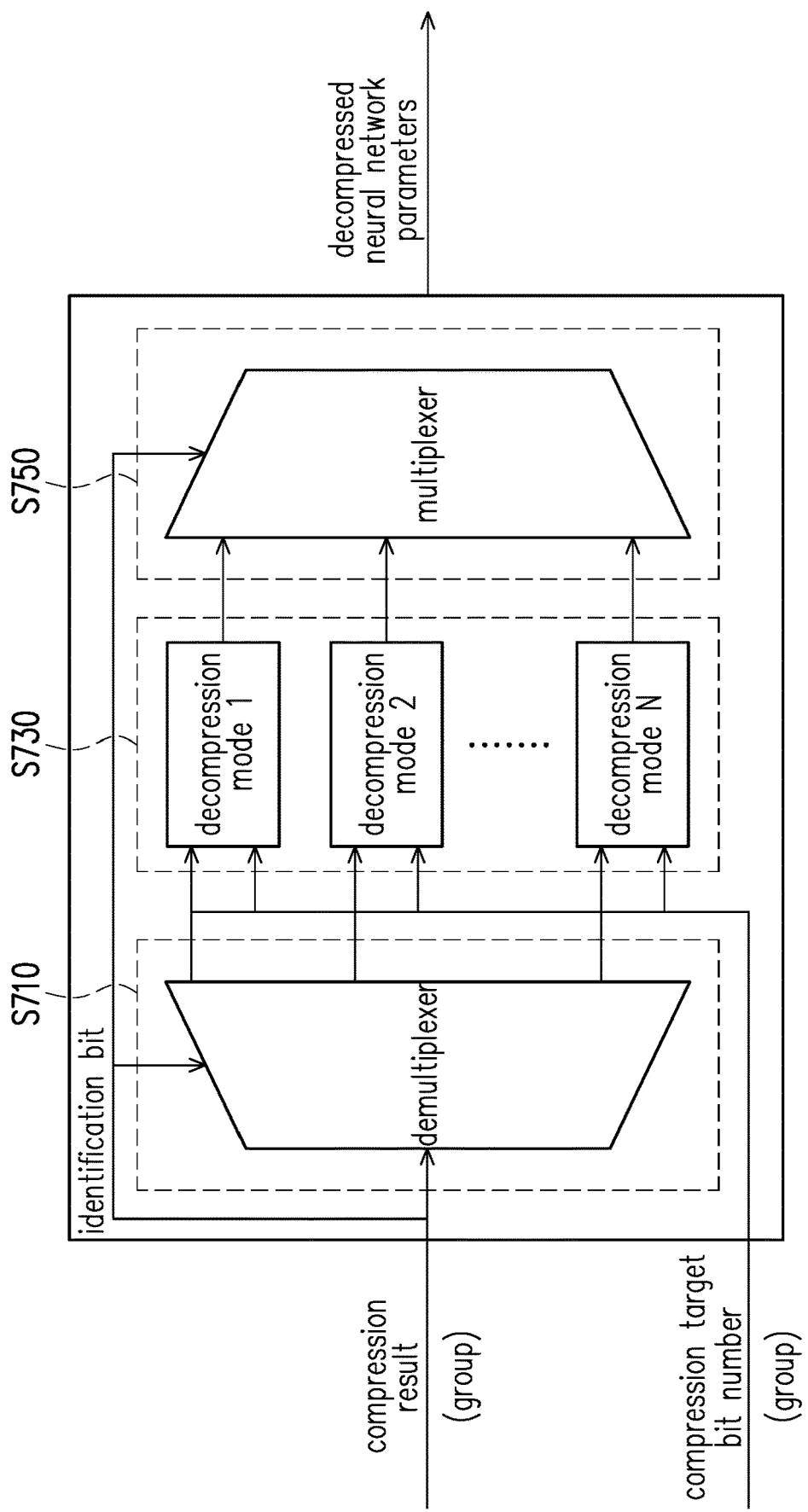
FIG. 7 is a flow chart of a decompression in accordance with an embodiment of the disclosure.

Through the method of independently compressing each compression combination, the embodiment of the disclosure may simultaneously perform the decompression process corresponding to the decompression mode on multiple compression results in parallel. FIG. 7 is a flow chart of a decompression in accordance with an embodiment of the disclosure. Referring to FIG. 7, the decompression process may be performed through the processor 130 or other circuit (not shown; for example, a tensor processing unit (TPU), a graphics processing unit GPU), or other specific neural network processors). However, for ease of illustration, the following will be illustrated with the processor 130, but is not limited to being implemented only by the processor 130. A demultiplexer (data selector) of the processor 130 determines the compression mode according to the identification bit in the compression result to select the corresponding decompression mode (Step S710). Next, the processor 130 performs the decompression process on the compression result according to the compression target bit number using the selected decompression mode (Step S730). Similarly, depending on different hardware resources, other compression results may also be simultaneously decompressed without waiting for any group of compression result to be decompressed first. Next, the multiplexer of the processor 130 may output the decompressed neural network parameters (Step S750).

In order to facilitate the reader to understand the spirit of the embodiments of the disclosure, an example will be illustrated below.

The neural network parameters are originally 16 bits. If every four neural network parameters form a group, the size of each compression combination before compression is 64 bits (16 bits×4). The computing system 100 may provide two compression ratios for the user to select from: if the compression target bit number is 25 bits, the compression ratio is 2.56 times (64 divided by 25); if the compression target bit number is 33 bits, the compression ratio is 1.94 times (64 divided by 33). It is assumed that the computing system 100 provides compression methods of two modes: a quantization compression method and an average compression method.

The quantization compression method uses linear quantization compression to compress each neural network parameter in each compression combination. If the compression target bit number is 25 bits, the processor 130 quantizes each neural network parameter from 16 bits to 6 bits. The compression formula thereof is to divide each neural network parameter by $2^{(16-6)}=2^{10}=1024$ and round to the nearest integer, so as to obtain a compression result. In which, the compression result is the compression results of the four neural network parameters (24 bits) combined with the identification bit of the quantization compression method (1 bit). The decompression process is to multiply the compression result by 1024. If the compression target bit number is 33 bits, the processor 130 quantizes each neural network parameter from 16 bits to 8 bits. The compression mode thereof is to divide each neural network parameter by $2^{(16-8)}=2^{8}=256$ and round to the nearest integer, so as to obtain a compression result. In which, the compression result is the compression results of the four neural network parameters (32 bits) combined with the identification bit of the quantization compression method (1 bit). The decompression mode is to multiply the compression result by 256.

On the other hand, the average compression method is to obtain an arithmetic mean A of the first two neural network parameters and an arithmetic mean B of the last two neural network parameters in each compression combination. The processor 130 then compresses the arithmetic mean A and the arithmetic mean B according to the compression target bit number. If the compression target bit number is 25 bits, the processor 130 quantizes the arithmetic mean A and the arithmetic mean B from 16 bits to 12 bits. The compression mode thereof is to divide the arithmetic mean A and the arithmetic mean B by $2^{(16-12)}=2^{4}=16$ and round to the nearest integer, so as to obtain a compression result. The decompression mode is to multiply the compression result by $2^{4}=16$. The decompression result of the arithmetic mean A represents the first two neural network parameters after decompression in the group and the decompression result of the arithmetic mean B represents the last two neural network parameters after decompression in the group. If the compression target bit number is 33 bits, the processor 130 respectively records the arithmetic mean A of the first two neural network parameters and the arithmetic mean B of the last two neural network parameters in the compression combination with 16 bits. When decompressing, the processor 130 directly uses the decompression result for the arithmetic mean A as the first two neural network parameters after decompression and uses the decompression result for the arithmetic mean B as the last two neural network parameters after decompression.

Actual values are used for exemplification. The number of parameters used in a single neural network algorithm is usually tens of thousands to millions, assuming that every neural network parameter is recorded in 16 bits (0 to 65535), and the neural network parameters thereof are, for example, 1310, 513, 2750, 282, 317, 318, 2119, 2132, etc. If four parameters form a group, the first group of compression combination is (1310, 513, 2750, 282), the second group of compression combination is (317, 318, 2119, 2132), and so on.

If the compression target bit number is 33 bits, the compression process is as follows:

The processor 130 compresses the first group of compression combination (1310, 513, 2750, 282). If a quantitative compression method is adopted:

| Original value | Compression result | Decompression result | Compression error | Compression distortion of whole group |
|---|---|---|---|---|
| 1310 | 1310/256 = 5 (0000_0101) | 5 × 256 = 1280 | 30 | 30 + 3 + 190 + 26 = 249 |
| 513 | 513/256 = 2 (0000_0010) | 2 × 256 = 516 | 3 | |

-continued

| Original value | Compression result | Decompression result | Compression error | Compression distortion of whole group |
|---|---|---|---|---|
| 2750 | 2750/256 = 10 (0000_1010) | 10 × 256 = 2560 | 190 | |
| 282 | 282/256 = 1 (0000_0001) | 1 × 256 = 256 | 26 | |

If an average compression method is adopted:

| Original value | Compression result | Decompression result | Compression error | Compression distortion of whole group |
|---|---|---|---|---|
| 1310 | (1310 + 513)/2 = 911 | 911 | 399 | 399 + 398 + 1234 + 1234 = 3265 |
| 513 | 0000_0011_1000_1111 | 911 | 398 | |
| 2750 | (2750 + 282)/2 = 1516 | 1516 | 1234 | |
| 282 | 0000_0101_1110_1100 | 1516 | 1234 | |

The compression distortion of 249 of the quantization compression method is less than the compression distortion of 3265 of the average compression method (the example uses the sum of compression errors as the compression distortion), so the processor 130 selects the compression result of the quantization compression method. The compression coding thereof is: 0_0000_0101_0000_0010_0000_1010_0000_0001, wherein the first bit of 0 represents the use of the quantization compression method. and those bits after the first bit are the compression result of every neural network parameter in order.

Next, the processor 130 compresses the second group of compression combination (317, 318, 2119, 2132). If the quantitative compression method is adopted:

| Original value | Compression result | Decompression result | Compression error | Compression distortion of whole group |
|---|---|---|---|---|
| 317 | 317/256 = 1 (0000_0001) | 1 × 256 = 256 | 61 | 61 + 62 + 71 + 84 = 278 |
| 318 | 318/256 = 1 (0000_0001) | 1 × 256 = 256 | 62 | |
| 2119 | 2119/256 = 8 (0000_1000) | 8 × 256 = 2048 | 71 | |
| 2132 | 2132/256 = 8 (0000_1000) | 8 × 256 = 2048 | 84 | |

If the average compression method is adopted:

| Original value | Compression result | Decompression result | Compression error | Compression distortion of whole group |
|---|---|---|---|---|
| 317 | (317 + 318)/2 = 317 | 317 | 0 | 0 + 1 + 6 + 7 = 14 |
| 318 | (0000_0001_0011_1101) | 317 | 1 | |
| 2119 | (2119 + 2132)/2 = 2125 | 2125 | 6 | |
| 2132 | (0000_1000_0100_1101) | 2125 | 7 | |

The compression distortion of 14 of the average compression method is less than the compression distortion of 278 of the quantization compression method, so the processor 130 selects the compression result of the average compression method. The compression coding thereof is: 1_0000_0001_0011_1101_0000_1000_0100_1101, wherein the first bit of 1 represents using the average compression method, and those bits after the first bit are the compression results of two groups of neural network parameters (317 and 318 being simultaneously compressed, and 2119 and 2132 being simultaneously compressed) in order after compression.

It should be noted that the average and quantization compression methods adopted in the foregoing examples are only used for illustrative purpose, other embodiments may adopt other compression methods, and the embodiments of the disclosure are not limited therein.

Based on the above, the computing system and the compression method for the neural network according to the embodiments of the disclosure group and compress the neural network parameters individually and independently, and limit the compression target bit number. Thereby, a large number of parameters used by the neural network occupying too much storage space may be prevented and consuming excessive power from accessing the parameters may be prevented. In addition, the embodiments of the disclosure provide various data compression modes, compress each group of neural network parameters using the data compression modes, and then select the compression result with the least compression distortion as the output, thereby improving elasticity and preventing excessive compression distortion.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A compression method for neural network parameters, comprising:
   obtaining a plurality of neural network parameters, wherein the plurality of neural network parameters are used for a neural network algorithm;
   grouping each of the plurality of neural network parameters into one of a plurality of encoding combinations, wherein each of the plurality of encoding combinations has at least two of the plurality of neural network parameters, and a number of the plurality of neural network parameters is the same in each of the plurality of encoding combinations; and
   compressing each of the plurality of encoding combinations into a same compression target bit number, wherein each of the plurality of encoding combinations is compressed independently and the compression target bit number is not larger than a bit number of each of the plurality of encoding combinations, the same compression target bit number is a total bit number of a compression result after compressing each of the plurality of encoding combinations, the total bit number of the compression result of each of the plurality of encoding combinations is the same, and the step of compressing each of the plurality of encoding combinations into the same compression target bit number comprises:
   compressing each of the plurality of encoding combinations through a plurality of different compression modes with the same compression target bit number; and
   selecting one of a plurality of compression results of the plurality of compression modes as a final compression result of the encoding combination according to compression distortions of the plurality of compression modes.

2. The compression method for neural network parameters according to claim 1, wherein the step of selecting one of the plurality of compression results of the plurality of compression modes comprises:
   appending an identification code corresponding to a selected compression mode to the final compression result.

3. The compression method for neural network parameters according to claim 2, further comprising:
   selecting one of the compression modes according to the identification code in the final compression result, so as to decompress the final compression result through the selected compression mode.

4. A computing system for neural network parameters, comprising:
   a memory; and
   a processor coupled to the memory and configured to execute:
   obtaining a plurality of neural network parameters, wherein the plurality of neural network parameters are used for a neural network algorithm;
   grouping each of the plurality of neural network parameters into one of a plurality of coding combinations, wherein each of the plurality of encoding combinations has at least two of the plurality of neural network parameters, and a number of the plurality of neural network parameters is the same in each of the plurality of encoding combinations;
   compressing each of the plurality of encoding combinations into a same compression target bit number, wherein each of the plurality of encoding combinations is compressed independently and the compression target bit number is not larger than a bit number of each of the plurality of encoding combinations, the same compression target bit number is a total bit number of a compression result after compressing each of the plurality of encoding combinations, the total bit number of the compression result of each of the plurality of encoding combinations is the same, and the the processor is configured to execute:
   compressing each of the plurality of encoding combinations through a plurality of different compression modes with the same compression target bit number; and
   selecting a result from a plurality of compression results of the plurality of compression modes as a final compression result of the encoding combination according to compression distortions of the plurality of compression modes; and
   storing a plurality of compression results of the plurality of encoding combinations in the memory.

5. The computing system for neural network parameters according to claim 4, wherein the processor is configured to execute:
   appending an identification code corresponding to a selected compression mode to the final compression result.

6. The computing system for neural network parameters according to claim 5, wherein the processor is configured to execute:
   selecting one of the compression modes according to the identification code in the final compression result to decompress the final compression result through the selected compression mode.

* * * * *